(12) United States Patent
Estacio et al.

(10) Patent No.: US 6,870,254 B1
(45) Date of Patent: Mar. 22, 2005

(54) FLIP CLIP ATTACH AND COPPER CLIP ATTACH ON MOSFET DEVICE

(75) Inventors: Maria Cristina B. Estacio, Cebu (PH); Maria Clemens Y. Quinones, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/548,946

(22) Filed: Apr. 13, 2000

(51) Int. Cl.$^7$ .................. H01L 23/48; H01L 23/52; H01L 23/495

(52) U.S. Cl. .............. 257/692; 257/690; 257/691; 257/698; 257/666; 257/673; 257/669; 257/674; 257/778

(58) Field of Search ................ 257/692, 690, 257/691, 698, 666, 673, 674, 669, 778, E23.039, E23.05, E23.085, 784

(56) References Cited

U.S. PATENT DOCUMENTS

| | | | |
|---|---|---|---|
| 4,766,479 A | * | 8/1988 | Krum et al. .................. 357/74 |
| 4,935,803 A | * | 6/1990 | Kalfus et al. ................ 257/673 |
| 5,018,002 A | * | 5/1991 | Neugebauer et al. .......... 357/68 |
| 5,103,290 A | * | 4/1992 | Temple et al. ................ 357/74 |
| 5,637,916 A | | 6/1997 | Joshi |
| 5,765,280 A | | 6/1998 | Joshi |
| 5,789,809 A | | 8/1998 | Joshi |
| 6,040,626 A | * | 3/2000 | Cheah et al. ................. 257/735 |
| 6,075,286 A | * | 6/2000 | Ewer .......................... 257/692 |
| 6,127,727 A | * | 10/2000 | Eytcheson ................... 257/692 |
| 6,133,634 A | | 10/2000 | Joshi |
| 6,294,403 B1 | | 9/2001 | Joshi |
| 6,307,755 B1 | * | 10/2001 | Williams et al. ............. 361/813 |
| 6,423,623 B1 | | 7/2002 | Bencuya |
| 6,459,147 B1 | * | 10/2002 | Crowley et al. ............. 257/692 |
| 6,469,384 B2 | | 10/2002 | Joshi |
| 6,489,678 B1 | | 12/2002 | Joshi |
| 6,566,749 B1 | | 5/2003 | Joshi et al. |
| 6,617,655 B1 | | 9/2003 | Estacio et al. |
| 6,627,991 B1 | | 9/2003 | Joshi |
| 6,633,030 B2 | | 10/2003 | Joshi |
| 6,645,791 B2 | | 11/2003 | Noquil et al. |
| 6,646,329 B2 | | 11/2003 | Estacio et al. |
| 6,649,961 B2 | | 11/2003 | Estacio et al. |
| 6,661,082 B1 | | 12/2003 | Granada et al. |
| 6,683,375 B2 | | 1/2004 | Joshi |
| 6,696,321 B2 | | 2/2004 | Joshi |
| 6,720,642 B1 | | 4/2004 | Joshi et al. |
| 6,731,003 B2 | | 5/2004 | Joshi et al. |
| 6,740,541 B2 | | 5/2004 | Rajeev |
| 6,753,605 B2 | | 6/2004 | Joshi |
| 6,762,067 B1 | | 7/2004 | Quinones et al. |
| 6,777,786 B2 | | 8/2004 | Estacio |

* cited by examiner

*Primary Examiner*—Nitin Parekh
(74) *Attorney, Agent, or Firm*—Townsend and Townsend and Crew LLP

(57) ABSTRACT

A chip device including a leadframe that includes source and gate connections, a bumped die including solder bumps on a top side that is attached to the leadframe such that the solder bumps contact the source and gate connections, and a copper clip attached to the backside of the bumped die such that the copper clip contacts drain regions of the bumped die and a lead rail. The chip device is manufactured by flip chipping a bumped die onto the leadframe and placing the copper clip on a backside of; the trench die such that the backside of the trench die is coupled to the lead rail. The process involves reflowing the solder bumps on the bumped die and solder paste that is placed between the copper clip and the backside of the bumped die.

8 Claims, 4 Drawing Sheets

FLIP CLIP ATTACH AND COPPER CLIP ATTACH ON MOSFET DEVICE

BACKGROUND OF THE INVENTION

1. Field of the Invention

The present invention relates to a chip device and a method of manufacture thereof and more particularly, to a chip device and a method of manufacture thereof that includes direct attachment of a bumped die to a leadframe and coupling of a set of leads to the bump die with a clip.

2. Description of the Prior Art

Semiconductor power switching devices, and particularly, power MOSFET devices continue to push the lower limits of on-state resistance. While silicon technology has advanced significantly in the past decade, essentially the same decades old package technology continues as the primary packaging means. The epoxy or soldered die attach along with aluminum or gold wire interconnects is still a preferred power device package methodology.

Recently, chip devices have been manufactured and packaged by connecting the die within the device to the leads directly through a low resistance solder connection. By using a second leadframe element and solder to connect the device conductors and the first leadframe, a direct connection is enabled. Furthermore, the size and shape of the second leadframe may be tailored to fit the chip device and to minimize its electrical and thermal resistance.

When gold wire bonding is done on a gate connection within a chip, the use of adhesives will introduce resin bleeds that are difficult to control and can interfere with the gate bond contact integrity. When silver-filled adhesives are used on the source and drain connections, since adhesives do not flow selectively, the resulting device is generally more prone to source shorting within the gate or drain. Additionally, adhesives generally have inferior electrical conductivity compared to solders.

Recently, copper straps have been used to couple dies to leads. Generally, with such arrangements, more than 60% of the die area is occupied by the copper strap with adhesives underneath the copper strap. This means less mold plastic is available to securely hold the internal assembly. Since a bigger area is allocated for adhesives, this also means more chances for void formation of the chip device.

Finally, general manufacturing processes for chip devices include attaching the backside of the die with epoxy. Generally, such adhesives have inferior thermal and electrical conductivity in comparison to solders.

SUMMARY OF THE INVENTION

The present invention provides a method of making a chip device wherein a bumped die that includes a plurality of solder bumps thereon is provided and a leadframe including source and gate connections is also provided. The bumped die is placed on the leadframe such that solder bumps contact the source and gate connections. A lead rail with a plurality of leads is provided along with a copper clip. The copper clip is attached to a backside of the bumped die with solder paste such that it contacts the drain regions of the bumped die and a lead rail and is further attached along an edge to the lead rail.

In accordance with one aspect of the present invention, the solder paste is placed on the backside of the bumped die prior to attaching the copper clip.

In accordance with a further aspect of the present invention, the solder paste is placed on the copper clip prior to attaching the copper clip.

In accordance with yet another aspect of the present invention, the solder bumps are reflowed prior to attaching the copper clip.

Thus, the present invention provides an improved chip device and a method of making it. The process does not require any wire bonding because the drain connections are directly soldered on the copper clip during solder reflow while the source and gate bumps are directly coupled to the leadframe. The resulting gate connections are more reliable compared to those produced by the gate wire bonding process. Additionally, solder is used for both the source and drain connections, and thus wetting can only happen on the solderable metals making it less probable for gate shorting as both connections are isolated with non-wettable areas. Additionally, solder alloys have better conductivity compared to adhesives, which leads to lower RDSon performance of the chip device.

Other features and advantages of the present invention will be understood upon reading and understanding the detailed description of the preferred exemplary embodiments, found hereinbelow, in conjunction with reference to the drawings, in which like numerals represent like elements.

DETAILED DESCRIPTION OF THE PREFERRED EXEMPLARY EMBODIMENTS

Figure 1:
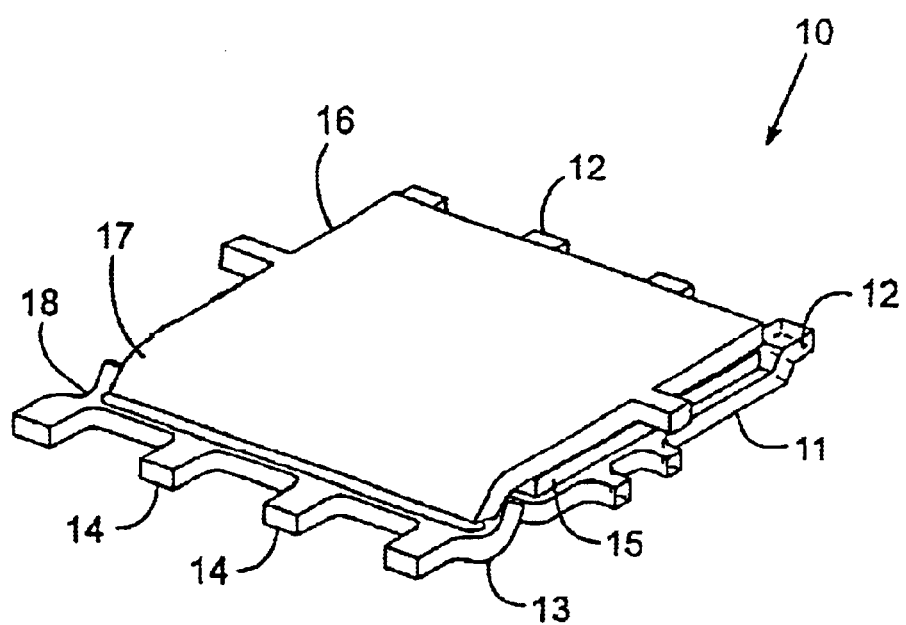
FIG. 1 is a perspective view of a chip device in accordance with the present invention.

FIG. 1 illustrates a chip device 10 in accordance with the present invention. The chip device includes a leadframe 11 that includes a plurality of leads 12 and a separate lead rail 13 that includes a plurality of leads 14. A bumped die 15 is attached to the leadframe. A clip 16 is placed on the bumped die backside and attached thereto. Additionally, an edge 17 of the clip is placed within a v-groove 18 of the lead rail.

Figure 4:
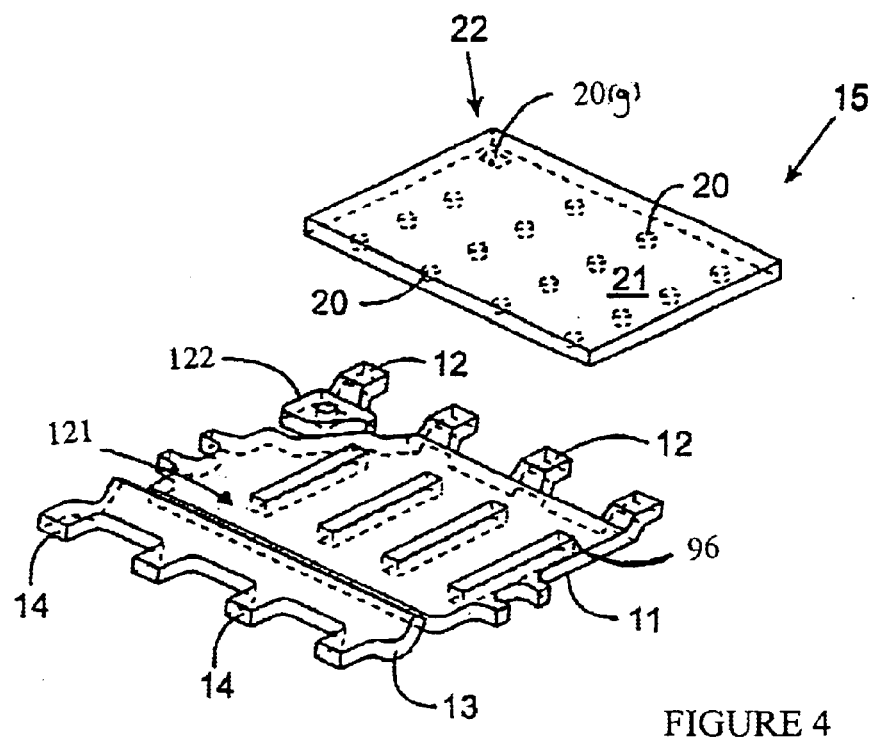
FIG. 4 is an exploded view of the bumped die and the leadframe for manufacturing a chip device in accordance with the present invention.
Figure 5:
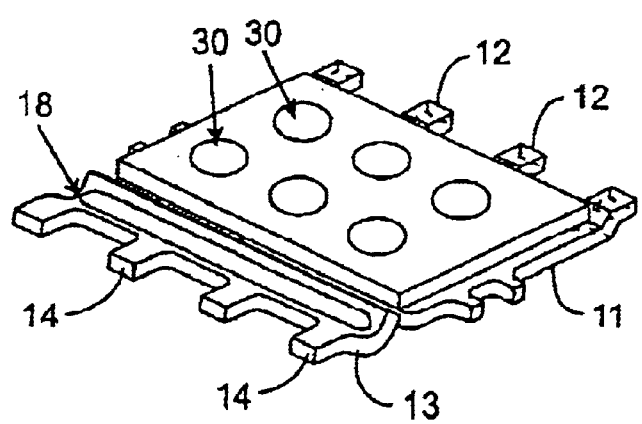
FIG. 5 is a perspective view of the bumped die and the leadframe coupled to one another.

As can be seen in FIG. 4, bumped die 15 includes a plurality of solder bumps 20, preferably arranged in rows over a source area 21 of the die on a top surface of the die. A solder bump 22 is also placed on a gate area 20g of the die, which is also on the top surface of the die.

Preferably, the bumped die is provided as a single unit.

Figure 2:
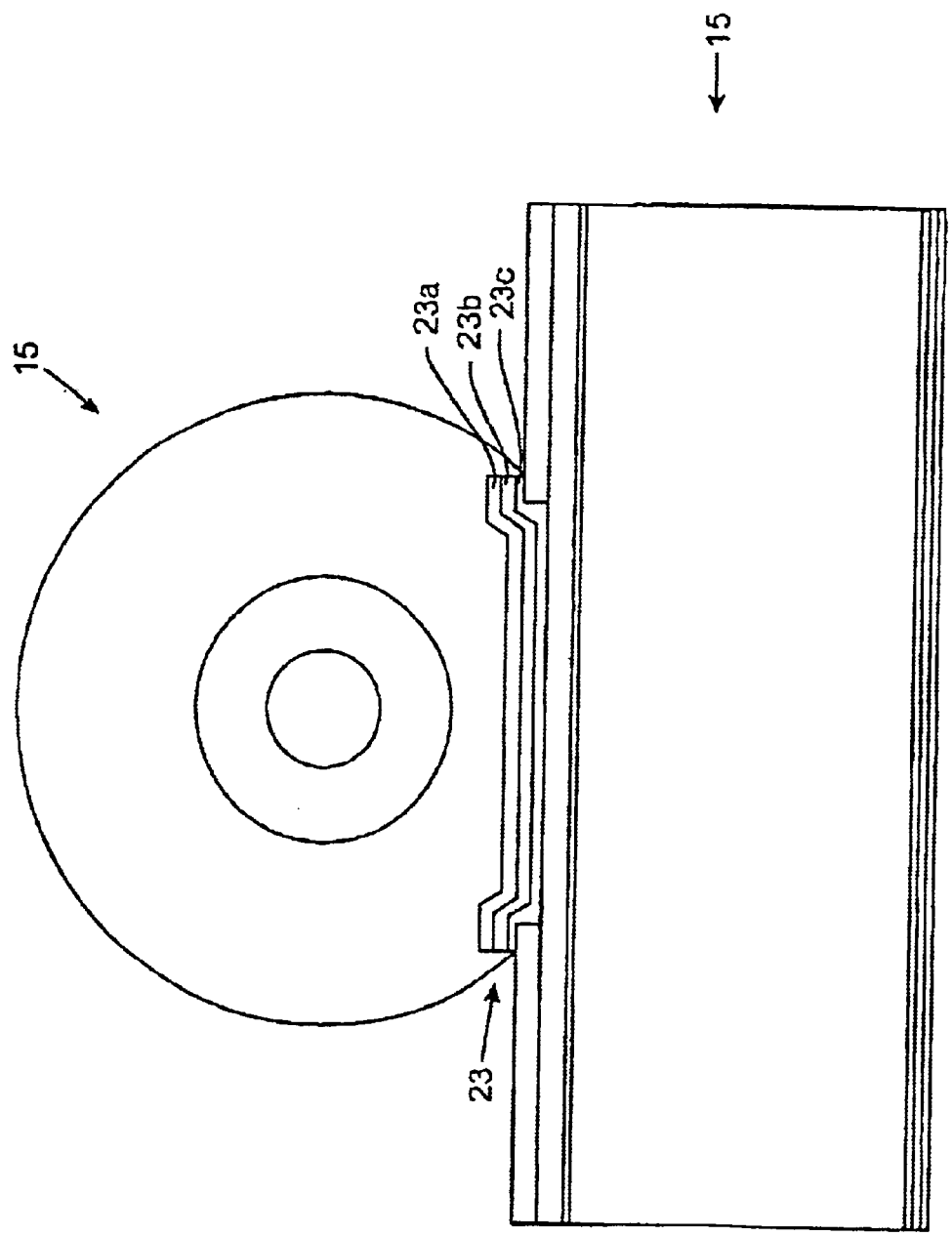
FIG. 2 is a schematic side sectional view of a bumped die.

Die 15 is preferably a one-piece item that is often referred to in the art as a "bumped die" As can be seen in FIG. 2, a bumped die includes a die an "under bump material" that serves as an intermediate layer 26 between the top surface of the die and solder bump 22, and the solder bump 22. Preferably, the under bump material is one of TiW, Cu, Au or an equivalent. In the example illustrated in FIG. 2, the under bump material is broken into three layers—Cu plating 26a, sputtered Cu 26b and sputtered Ti 26d.

Figure 3:
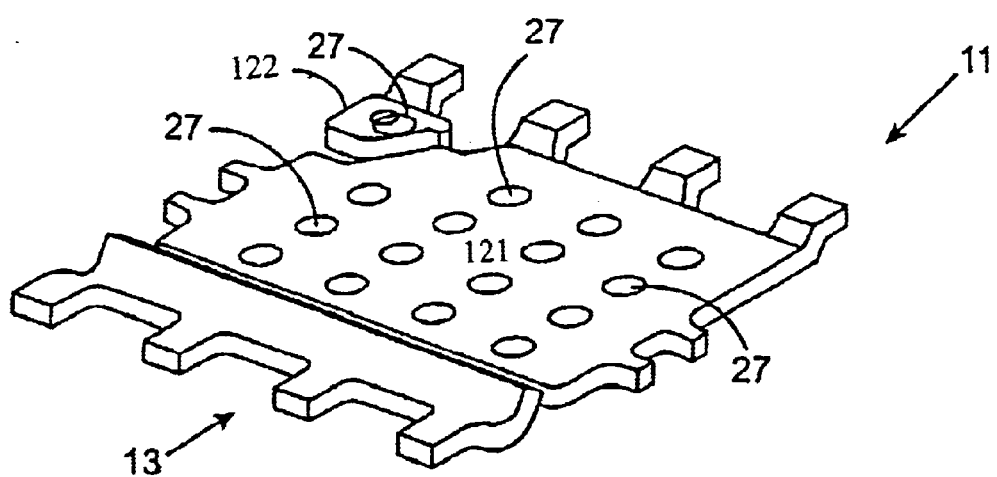
FIG. 3 is a perspective view of a leadframe with flux dispensed thereon for manufacturing a chip device in accordance with the present invention.

FIG. 3 illustrates leadframe 11 with flux 27 dispensed thereon. The flux may be dispensed, for example, by stamping, with a multi-needle dispense nozzle or any other suitable method known in the art.

Referring to FIGS. 3 and 4, the bumped die is preferably flip chip attached on to leadframe 11, i.e., it is "flipped" from a sawn tape onto the leadframe. As shown, the leadframe 11 includes a number of elongated apertures 96 that are disposed under the bumped die 15 when the bumped die 15 is mounted on the leadframe 11. As shown, when the bumped die 15 is mounted on the leadframe, the elongated apertures 96 are between the solder bumps of the bumped die 15. The bumped die 15 is placed on the leadframe 11 such that gate solder bump 22 contacts the gate connection region 122 on the leadframe 11 while the source solder bumps 20 contact the source connections 121 on the leadframe 11.

Solder paste 30 is disposed on a backside of the bumped die and into elongated v-groove 18 in lead rail 13. Clip 16, preferably consisting of copper, is supplied, (preferably in reel form) and pick and placed onto the die backside such that edge 17 of the copper clip is placed within the elongated v-grove. Thus, the clip provides contact with the chip's drain regions (which are located on the chip's backside and couples these drain regions to leads 14 of the lead rail 13.

In one embodiment of the present invention, during manufacturing of the chip device, after coupling the clip to the backside of the bumped die and the lead rail, a one time reflow of the solder bumps on the bumped die and the solder paste on the die backside is performed. In an alternative embodiment, the solder bumps may be reflowed after flip chip attaching the bumped die to the leadframe and then a second reflow is performed after placing the copper clip on the die backside.

Accordingly, the present invention provides an improved chip device and simple methods for manufacturing it. The manufacturing process does not require any wire bonding because the drain connections are directly soldered on the copper clip during solder reflow while the source and gate bumps are directly coupled to the leadframe. The resulting gate connections are more reliable compared to those produced by the gate wire bonding process. Additionally, solder is used for both the source and drain connections, and thus wetting can only happen on the solderable metals making it less probable for gate shorting as both connections are isolated with non-wettable areas. Additionally, solder alloys have better conductivity compared to adhesives, which leads to lower RDSon performance of the chip device.

Although the invention has been described with reference to specific exemplary embodiments, it will appreciated that it is intended to cover all modifications and equivalents within the scope of the appended claims.

What is claimed is:

1. A chip device comprising:

a leadframe including source and gate connections;

a bumped die having solder bumps including source solder bumps and a gate solder bump source and gate on a frontside, the bumped die being attached to the leadframe such that the solder bumps contact the source and gate connections respectively;

a copper clip attached to a backside of the bumped die and having an edge;

a lead rail including leads and an elongated v-groove along an edge of the lead rail, wherein the edge of the copper clip is in the elongated v-groove along the edge of the lead rail;

solder paste coupling the edge of the copper clip and the elongated v-grove of the lead rail; and apparatus in the leadframe and being located under the die and being between the source solder bumps.

2. A chip device in accordance with claim 1 wherein the copper clip is attached to the bumped die with solder paste.

3. A chip device of claim 1, wherein the lead rail comprises copper.

4. A chip device of claim 1, wherein the lead frame and the lead rail comprise copper.

5. A chip device of claim 1, wherein the bumped die comprises an underbump metallurgy layer.

6. A chip device of claim 1, wherein the bumped die comprises an underbump metallurgy layer comprising Ti.

7. A chip device of claim 1, wherein the edge of the copper clip terminates in the elongated v-groove.

8. A chip device of claim 1, further comprising flux on the leadframe.

* * * * *

UNITED STATES PATENT AND TRADEMARK OFFICE
CERTIFICATE OF CORRECTION

PATENT NO. : 6,870,254 B1
DATED : March 22, 2005
INVENTOR(S) : Estacio et al.

It is certified that error appears in the above-identified patent and that said Letters Patent is hereby corrected as shown below:

Column 4,
Line 25, kindly delete "apparatus", and insert -- apertures --

Signed and Sealed this

Twenty-fourth Day of May, 2005

JON W. DUDAS
*Director of the United States Patent and Trademark Office*

UNITED STATES PATENT AND TRADEMARK OFFICE
CERTIFICATE OF CORRECTION

PATENT NO.    : 6,870,254 B1
DATED         : March 22, 2005
INVENTOR(S)   : Estacio et al.

It is certified that error appears in the above-identified patent and that said Letters Patent is hereby corrected as shown below:

<u>Column 4,</u>
Line 11, kindly delete "source and gate".
Line 13, kindly delete "that the solder bumps", and insert -- that the source and gate solder bumps --.

Signed and Sealed this

Thirteenth Day of September, 2005

JON W. DUDAS
*Director of the United States Patent and Trademark Office*